(12) United States Patent
Venugopal et al.

(10) Patent No.: US 10,804,201 B2
(45) Date of Patent: Oct. 13, 2020

(54) DISSIMILAR MATERIAL INTERFACE HAVING LATTICES

(71) Applicant: TEXAS INSTRUMENTS INCORPORATED, Dallas, TX (US)

(72) Inventors: Archana Venugopal, Dallas, TX (US); Benjamin Stassen Cook, Addison, TX (US); Nazila Dadvand, Richardson, TX (US); Luigi Colombo, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/236,101

(22) Filed: Dec. 28, 2018

(65) Prior Publication Data

US 2019/0206793 A1 Jul. 4, 2019

Related U.S. Application Data

(60) Provisional application No. 62/611,441, filed on Dec. 28, 2017.

(51) Int. Cl.
| | |
|---|---|
| *H01L 23/528* | (2006.01) |
| *H01L 21/768* | (2006.01) |
| *H01L 23/532* | (2006.01) |
| *C01B 32/184* | (2017.01) |
| *H01L 23/522* | (2006.01) |

(52) U.S. Cl.
CPC ........ *H01L 23/5283* (2013.01); *C01B 32/184* (2017.08); *H01L 21/76823* (2013.01); *H01L 21/76838* (2013.01); *H01L 21/76874* (2013.01); *H01L 23/5226* (2013.01); *H01L 23/53228* (2013.01); *H01L 23/53276* (2013.01); *H01L 23/5329* (2013.01)

(58) Field of Classification Search
CPC ............ H01L 23/5283; H01L 23/5226; H01L 23/53228; H01L 23/53276; H01L 23/5329; H01L 21/76823; H01L 21/76838; H01L 21/76874; C01B 32/184
USPC .......................................................... 257/750
See application file for complete search history.

(56) References Cited

U.S. PATENT DOCUMENTS

| | | | |
|---|---|---|---|
| 9,793,214 B1* | 10/2017 | Venugopal ........ H01L 23/53238 |
| 2009/0057766 A1* | 3/2009 | Lu ..................... H01L 21/76829 |
| | | | 257/356 |
| 2011/0059599 A1* | 3/2011 | Ward .................. H01L 29/1606 |
| | | | 438/507 |
| 2014/0117559 A1* | 5/2014 | Zimmerman ......... H01L 23/481 |
| | | | 257/774 |
| 2017/0223828 A1* | 8/2017 | Tanielian ................. C25D 5/54 |
| 2018/0166598 A1* | 6/2018 | Okandan ................. H01L 31/00 |

OTHER PUBLICATIONS

Xiaoyu Zheng et. al., Ultralight, Ultrastiff Mechanical Metamaterials; Science 344 (2014) 1373-1377.
T. A. Schaedler, et al., Ultralight Metallic Microlattices; Science 334 (2011) 962-965.

* cited by examiner

*Primary Examiner* — Tu-Tu V Ho
(74) *Attorney, Agent, or Firm* — Dawn Jos; Charles A. Brill; Frank D. Cimino

(57) ABSTRACT

A structure for a semiconductor device includes a dielectric layer and a metal layer. The structure also includes a plurality of unit cells. Each unit cell is formed of interconnected segments. The plurality of unit cells forms a lattice. The lattice is between the dielectric layer and the metal layer.

19 Claims, 6 Drawing Sheets

DISSIMILAR MATERIAL INTERFACE HAVING LATTICES

CROSS-REFERENCE TO RELATED APPLICATION(S)

This application claims priority to U.S. Provisional Application No. 62/611,441, filed Dec. 28, 2017, which is hereby incorporated by reference.

This application is related to commonly owned U.S. Application Ser. No. 62/611,469, filed Dec. 28, 2017, entitled "LATTICE BUMP INTERCONNECT".

BACKGROUND

Dissimilar materials at back-end-of-line (BEOL) dielectric/metal interfaces have dissimilar thermal expansion properties. This can result in stress in BEOL films and across the BEOL film interfaces during events like temperature and current fluctuations during operation of a semiconductor device. The stress in turn can lead to problems such as dielectric cracking and metal seepage into the dielectric. Thus, in order to solve these problems, it is desirable to provide a semiconductor device that is able to overcome the above disadvantages. Advantages of the present invention will become more fully apparent from the detailed description of the invention hereinbelow.

SUMMARY

In one aspect of the disclosure, a structure for a semiconductor device includes a dielectric layer and a metal layer. The structure also includes a plurality of unit cells. Each unit cell is formed of interconnected graphene segments. The plurality of unit cells forms a graphene lattice. The graphene lattice is between the dielectric layer and the metal layer.

In another aspect of the disclosure, a structure for a semiconductor device includes a dielectric layer and a metal-filled via. The structure also includes a plurality of unit cells. Each unit cell is formed of interconnected graphene segments. The plurality of unit cells forms a graphene lattice. The graphene lattice is between the dielectric layer and the metal-filled via.

In yet another aspect of the disclosure, a structure for a back-end-of-line (BEOL) portion of an integrated circuit package includes a dielectric layer, a metal layer, and a metal-filled via connected to the metal layer. The structure also includes a plurality of graphene lattices. Each graphene lattice includes a plurality of unit cells. Each unit cell is formed of interconnected graphene segments. A first graphene lattice of the plurality of graphene lattices is between the dielectric layer and the metal layer. A second graphene lattice of the plurality of graphene lattices is between the dielectric layer and the metal-filled via.

In yet another aspect of the disclosure, a method of forming a structure for a back-end-of-line (BEOL) portion of an integrated circuit package includes forming a dielectric layer, forming a metal layer, and forming a metal-filled via connected to the metal layer. The method also includes forming a plurality of graphene lattices between the dielectric layer and the metal layer, and between the dielectric layer and the metal-filled via. Each graphene lattice is formed by photo-initiating the polymerization of a monomer in a pattern of unit cells to form a polymer lattice (wherein each unit cell is formed of interconnected segments), removing the unpolymerized monomer, coating the polymer lattice with a metal, removing the polymer lattice to leave a metal lattice, depositing graphitic carbon on the metal lattice, converting the graphitic carbon to form graphene or graphitic tubes after the removal of the metal lattice.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

For purposes of this disclosure, the phrase "integrated circuit package" may alternatively encompass a "semiconductor device" (and derivatives thereof) and thus, may be used interchangeably.

For purposes of this disclosure, the term "lattice" may alternatively encompass "microlattice", "nanolattice", and "superlattice" (and derivatives thereof) and thus, may be used interchangeably. Similarly, the term "structure" may alternatively encompass "microstructure", "nanostructure", and "superstructure" (and derivatives thereof) and thus, may be used interchangeably.

Figure 2:
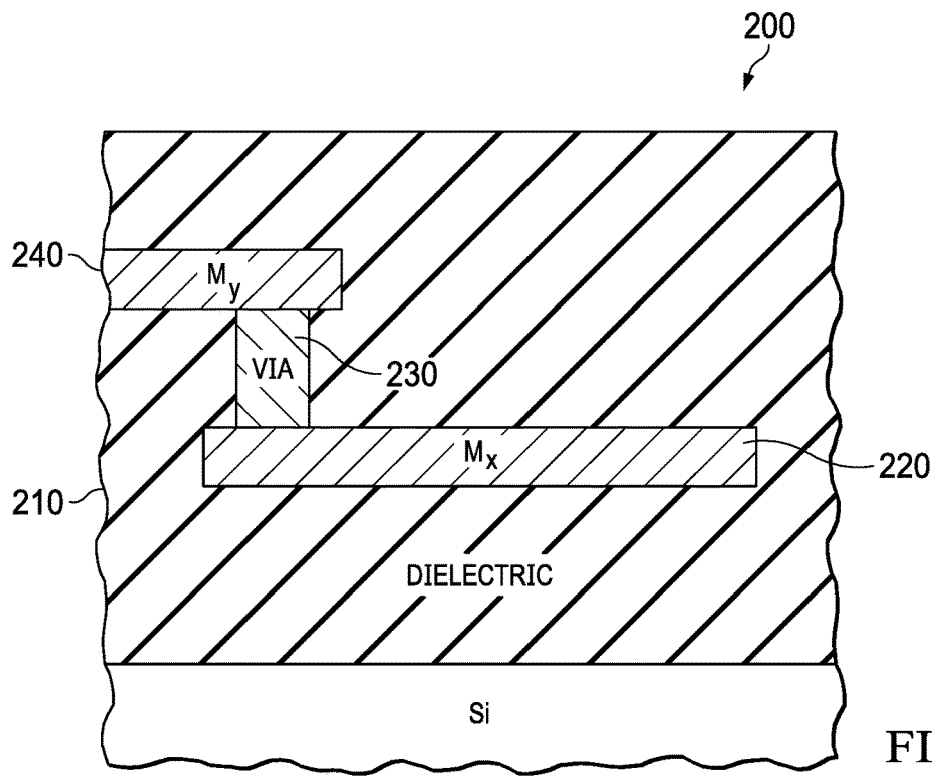
FIG. 2 is a cross-sectional side view of a structure for a semiconductor device.

With reference to the semiconductor device structure 200 of FIG. 2, dissimilar materials at back-end-of-line (BEOL) dielectric 210/metal (e.g., metal layer 220, metal layer 240, and/or metal-filled via 230) interfaces have dissimilar thermal expansion properties. This can result in stress in layers/films and across their interfaces during events such as temperature excursions during device operation, annealing during processing, or temperature fluctuations induced by current fluctuations during operation of a semiconductor device. The stress in turn can lead to problems such as dielectric 210 cracking and metal seepage/diffusion through the cracks into the dielectric 210. Thus, in order to solve these problems, graphene microlattices 350 (see FIGS. 3A-3D) are formed between the dielectric/metal interfaces. A lattice is a repeating structure based on a unit cell, the unit cell can vary across the lattice, or the lattice can be a combination of several unit cells. The graphene lattices 350 that may be employed may be fabricated as described hereinbelow.

It has been found that an organic/inorganic superstructure may be used as a template for the formation of a 3D metal superstructure that may then be used to grow graphitic carbon on the surface of the metal. The template may be fabricated through a self-propagating photopolymer waveguide technique (see, e.g., Xiaoyu Zheng et. al., Ultralight, Ultrastiff Mechanical Metamaterials; *Science* 344 (2014) 1373-1377 and T. A. Schaedler, et al., Ultralight Metallic Microlattices; *Science* 334 (2011) 962-965) in which an interconnected 3D photopolymer lattice may be produced upon exposure of an appropriate liquid photomonomer to collimated UV light through a specifically designed mask that contains openings with certain spacing and size. The fabricated microlattice may then be then coated with copper or other suitable metal (e.g. Ni, Co, Au, Ag, Cu, and alloys thereof) by an electroless process followed by etching away the organic polymeric matrix (scaffold) leaving behind the metal microlattice. The resulting metal-based microlattice may be then used as a template for the growth of graphitic carbon at some optimal temperature (e.g., between 100° C.-1000° C.) such that the microlattice structure is minimally disturbed. The thickness of the electroless plated metal may be controlled in the range of nanometer to micrometer by adjusting the plating time, temperature, and/or plating chemistry.

Figure 1:
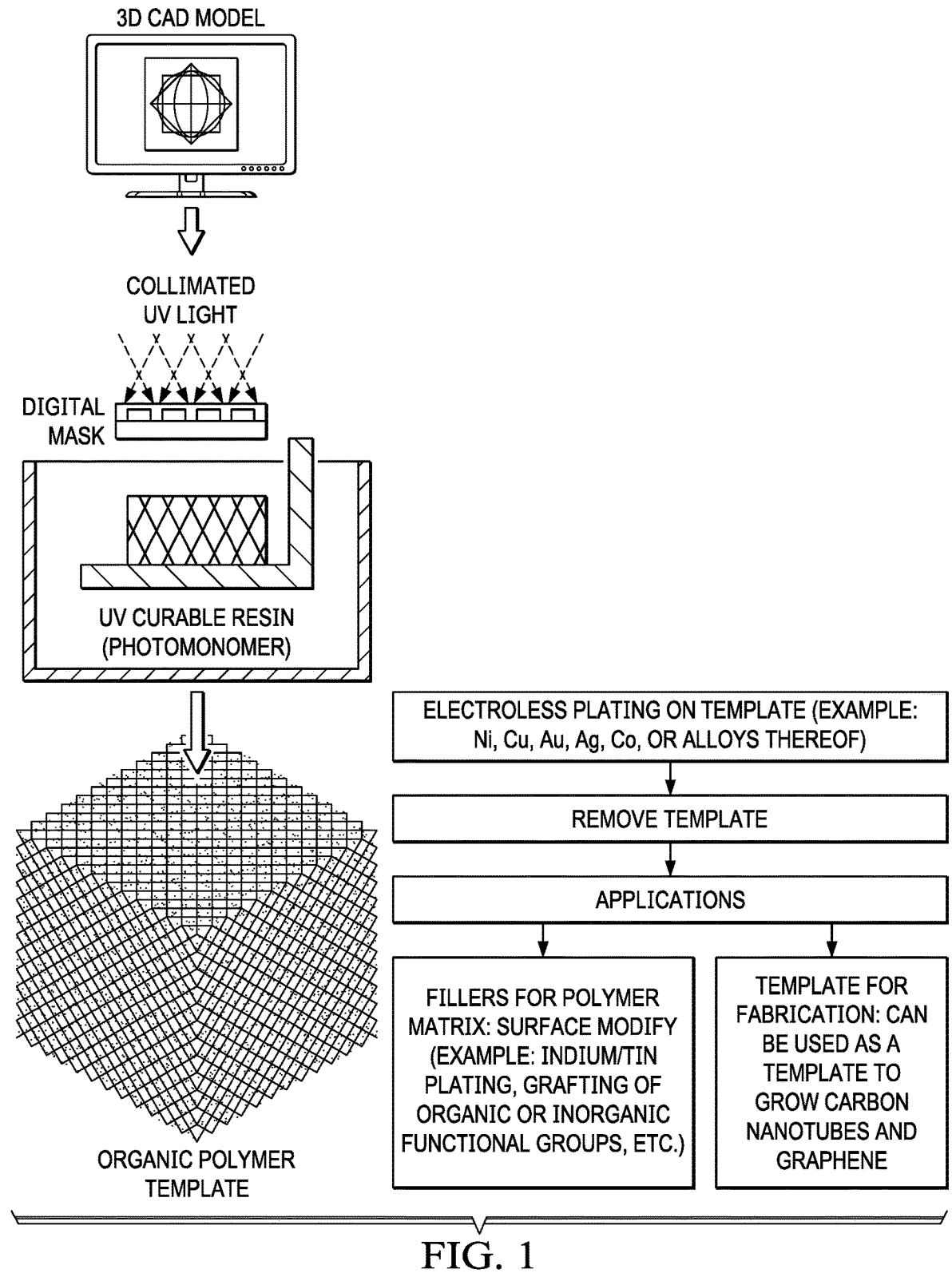
FIG. 1 is a schematic drawing and flowchart of a fabrication process for a metal-based microlattice template, in accordance with this disclosure.

The left portion of FIG. 1 schematically illustrates an exemplary fabrication process of an organic polymeric microlattice (scaffold) prior to coating with electroless plating.

The present disclosure employs a "periodically structured" graphene nanostructure. The graphitic carbon or graphene is grown on the metal microlattice formed by electroless plating mentioned above by a chemical vapor deposition process. In this process the metal microlattice is exposed to a mixture of hydrogen and a hydrocarbon such as methane, ethylene, etc., or oxygen containing hydrocarbons such as ethanol, methanol, etc., at a temperature ranging from 100° C. to 1000° C., the maximum temperature depending upon the device thermal budget. The growth can take place either thermally or in the presence of a plasma. This process will lead to graphene or graphitic films depending upon the metal used for the metal microlattice. It is important to note that in order to ensure that the metal structures do not agglomerate as a result of high metal surface mobility especially at higher temperatures, the surface of the metal can be chemically treated to minimize surface diffusion and agglomeration.

The present process may be used to create a regular array, and a superstructure with various dimensions on demand that we will refer to as a unit cell as shown in FIGS. 6A-6D. While in the case of a crystal, the unit cell is formed of individual atoms. In this case the unit cell is formed of intersecting graphitic carbon tubes. The resulting superstructures may be optimized for strength, thermal and other fundamental properties.

There are several aspects of this procedure that are noteworthy:
- it provides a regular structure with defined dimensions;
- it has the ability to form very thin metal (e.g. Ni, Co, Cu, Ag, Au, W, Ti, Zr, Hf, and alloys of these metals) microlattices; and
- it enables the formation of graphitic carbon on very thin metals, thin metal wires or tubes.

The present process uses a polymeric structure as a template for such fabrication with the subsequent formation of a metal superstructure that may then be exposed to a hydrocarbon (e.g. methane, ethylene, acetylene, benzene, and oxygen containing hydrocarbons such as alcohols) to form graphitic carbon, followed by etching of the metal from under the graphitic carbon using appropriate etchants such as, for example, $FeCl_3$ or potassium permanganate.

Collimated light through a photomask or multi-photon photography may be used in a photo-initiated polymerization to produce a polymer microlattice comprised of a plurality of unit cells. Exemplary polymers include polystyrene and poly(methyl methacrylate) (PMMA). Once polymerized in the desired pattern, the remaining un-polymerized monomer may be removed.

The polymer structure (polymer scaffold) may then be plated with a suitable metal using an electroless plating process.

For example, electroless nickel plating (EN) is an autocatalytic chemical technique that may be used to deposit a layer of nickel-phosphorus or nickel-boron alloy on a solid workpiece, such as metal, plastic, or ceramic. The process relies on the presence of a reducing agent, for example hydrated sodium hypophosphite ($NaPO_2H_2.H_2O$) which reacts with the metal ions to deposit metal. Alloys with different percentages of phosphorus, ranging from 2-5 (low phosphorus) to up to 11-14 (high phosphorus) are possible. The metallurgical properties of the alloys depend on the percentage of phosphorus.

Electroless plating has several advantages over electroplating. Free from flux-density and power supply issues, it provides an even deposit regardless of workpiece geometry, and with the proper pre-plate catalyst, may deposit on non-conductive surfaces. In contradistinction, electroplating can only be performed on electrically conductive substrates.

Before performing electroless plating, the material to be plated must be cleaned by a series of chemicals; this is known as the pre-treatment process. Failure to remove unwanted "soils" from the part's surface results in poor plating. Each pre-treatment chemical must be followed by water rinsing (normally two to three times) to remove chemicals that may adhere to the surface. De-greasing removes oils from surfaces, whereas acid cleaning removes scaling.

Activation may be done with an immersion into a sensitizer/activator solution—for example, a mixture of palladium chloride, tin chloride, and hydrochloric acid. In the case of non-metallic substrates, a proprietary solution is often used.

The pre-treatment required for the deposition of metals on a non-conductive surface usually consists of an initial surface preparation to render the substrate hydrophilic. Following this initial step, the surface may be activated by a solution of a noble metal, e.g., palladium chloride. Electroless bath formation varies with the activator. The substrate is then ready for electroless deposition.

The reaction is accomplished when hydrogen is released by a reducing agent, normally sodium hypophosphite (with the hydrogen leaving as a hydride ion) or thiourea, and oxidized, thus producing a negative charge on the surface of the part. The most common electroless plating method is electroless nickel plating, although silver, gold and copper layers can also be applied in this manner.

In principle any hydrogen-based reducing agent can be used although the redox potential of the reducing half-cell must be high enough to overcome the energy barriers inherent in liquid chemistry. Electroless nickel plating most often employs hypophosphite as the reducer while plating of other metals like silver, gold and copper typically makes use of low-molecular-weight aldehydes.

A benefit of this approach is that the technique can be used to plate diverse shapes and types of surfaces.

As illustrated in FIG. 1, the organic polymeric microlattice may be electrolessly plated with metal (e.g., comprising copper or nickel) followed by dissolving out the organic polymer scaffold. The fabricated metal-based microlattice is used as a template to synthesize a graphitic carbon superstructure. The metal may then be etched out to produce a graphene microstructure comprising a plurality of unit cells wherein each unit cell is formed of interconnected graphene tubes.

As an alternative to or in addition to the above processes, the graphene lattices may be formed via any of the fabrication techniques (or portion(s) of the fabrication techniques thereof, including any pre-treatments) described in U.S. Provisional Application Ser. No. 62/611,347, filed Dec. 28, 2017, entitled "SP$^2$-Bonded Carbon Structures", all of which are hereby incorporated in this disclosure.

Figure 3A:
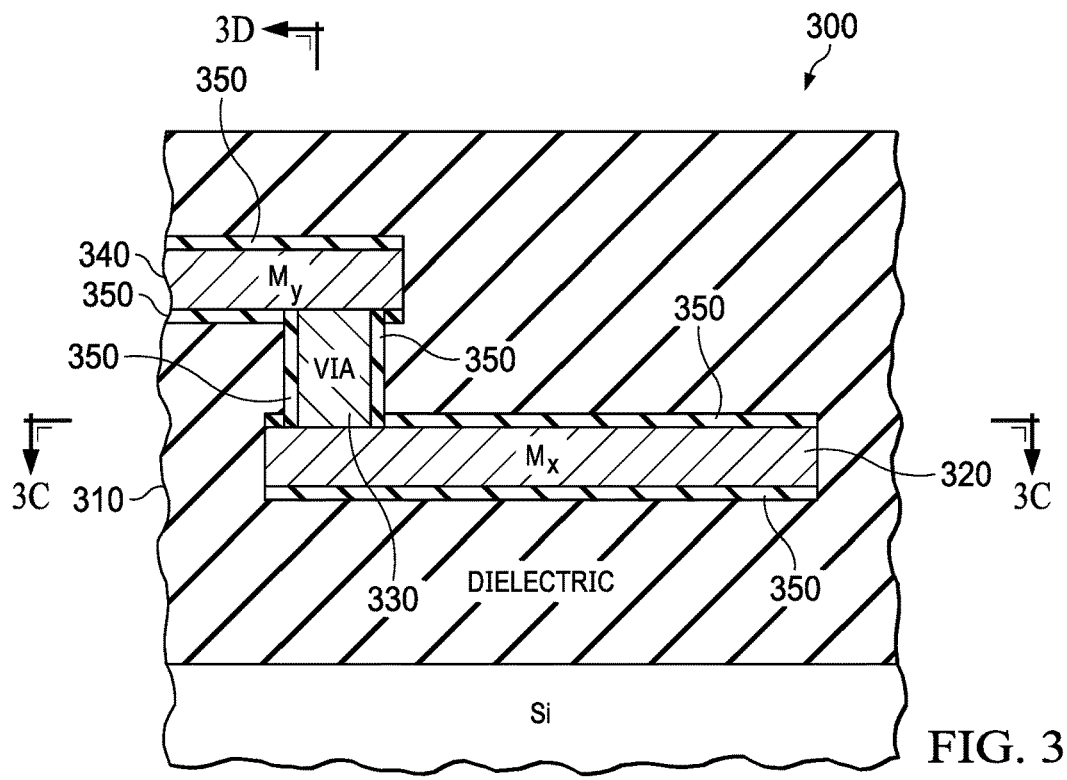
FIG. 3A is a cross-sectional side view of a structure of back-end-of-line (BEOL) aluminum (Al) wiring and tungsten (W) vias, for a semiconductor device, in accordance with this disclosure.

With reference to FIG. 3A, stress in dielectric layer 310 and metal layer 320 (and/or metal layer 340) and/or metal-filled via 330, and across these dielectric/metal interfaces during events like temperature and current fluctuations during operation of a semiconductor device occurs. This stress can lead to problems such as dielectric 310 cracking (e.g., via association with hot spots) and metal seepage (from metal layer 320, metal layer 340, and/or metal-filled via 330) into the dielectric 310. As mentioned above, in order to solve these problems (e.g., stress relief between multiple dissimilar materials having different coefficients of thermal expansion), graphene lattices 350 are formed between the dielectric/metal interfaces. The coefficient of thermal expansion of the dielectric (when it is, for example, $SiO_2$) is $9 \times 10^{-6}/°$ C., whereas the coefficient of thermal expansion of the metal (when it is, for example, aluminum (Al)) used in the metal layer 320, metal layer 340, and/or metal-filled via 330 is $24 \times 10^{-6}/°$ C.

Metal layer 320, metal layer 340, and metal-filled via 330 may be formed via conventional processes within the dielectric 310 to form the dielectric stack of a back-end-of-line (BEOL) portion of a semiconductor device, with the exception of the formation of the graphene lattices which isolate the dielectric material from the metal layer 320, metal layer 340, and/or metal-filled via 330. For example, a back-end process may involve the deposition of dielectric followed by etching of the dielectric and blanket deposition of metal and metal etch to get vias and metal interconnects (i.e., metal layers 320 (or 340)).

However, the processes for forming the graphene lattices, as described above, are performed prior to formation of the metal layer 320, metal layer 340, and metal-filled via 330.

The graphene lattices will grow at the interfaces of the dielectric 310 and any or all of the metal layer 320, metal layer 340, and metal-filled via 330, in order to provide stress relief between two dissimilar materials. Without the graphene lattices, the solid materials (and corresponding stepped interface) of the dielectric and metals (while having dissimilar thermal expansion properties due to dissimilar thermal expansion coefficients) have an abrupt change in thermal expansion at the interface.

The graphene lattices at the dielectric/metal interfaces enable stress relief because the graphene lattices provide an intermediary boundary between the dielectric solid material (e.g., $SiO_2$, $Al_2O_3$, $ZrO_2$, SiN, Tetraethyl Orthosilicate (TEOS), Polyimide, polybenzoxazole (PBO), benzocyclobutene (BCB)) and the solid material of the metal layer 320, metal layer 340, and/or metal-filled via 330 (e.g., W, Cu, Al, Ni, Pd, Au, Ag) that serves as a stress-relief buffer instead of a stepped interface between solid materials having dissimilar coefficients of thermal expansion. In other words, the graphene lattices avoid having an abrupt transition between dielectric and metal materials having different thermal expansion coefficients. Heat, therefore, is dissipated and spread about in a gradual manner during operation of the semiconductor device. The extent to which the metal material(s) heats up is reduced with the graphene lattices present around the metal material(s). Since the coefficients of thermal expansion at the metal/dielectric interfaces are different, during temp cycling the different rates of expansion and contraction will result in high interfacial stress and the formation of cracks and corresponding reliability issues. The presence of the lattice, which is structured to be compressible/expandable, allows for buffering of the stress at the interface and mitigation of reliability issues.

Any of the graphene lattice formation processes mentioned above may be employed, but the high temperature involved for processing at least the carbon or graphene process steps may be excessive for the process to be performed in situ, i.e., with the metal layer or wire (in the via—which forms the metal-filled via) present. Therefore, it may be optional to alternatively use lower temperature processes by using alloys (such as Ni—Cu with varying percentages of Ni and Cu to change the solubility of carbon) instead of just Cu (or other conducting material) to grow the graphene. This may alter the process from being surface mediated to diffusion-precipitation based. In either scenario, the voids of the graphene lattice will be empty and will not contain any dielectric.

With additional reference to FIG. 3A, in one aspect of the disclosure, a structure 300 for a semiconductor device includes a dielectric layer 310 and a metal layer 320 (or 340). The structure 300 also includes a plurality of unit cells. Each unit cell is formed of interconnected graphene segments. The plurality of unit cells forms a graphene lattice 350 (a plurality of which are shown in layered form in FIGS. 3A-3D). The graphene lattice 350 is between the dielectric layer 310 and the metal layer 320 (or 340). FIG. 3C is a cross-sectional top view of a structure for a semiconductor device taken along line 3C shown in FIG. 3A, and FIG. 3D is a cross-sectional side view of a structure for a semiconductor device taken along line 3D shown in FIG. 3A.

In an example, the dielectric layer 310 and the metal layer 320 (or 340) are at least part of a back-end-of-line (BEOL) portion of a semiconductor device.

In an example, the dielectric layer 310 comprises at least one material selected from the group consisting of $SiO_2$, $Al_2O_3$, $ZrO_2$, SiN, Tetraethyl Orthosilicate (TEOS), Polyimide, PBO, BCB, and combinations thereof, and the metal layer 320 (or 340) comprises at least one element selected from the group consisting of W, Cu, Al, Ni, Pd, Au, Ag, and combinations thereof.

In an example, the metal layer 320 (or 340) has a coefficient of thermal expansion that is different than a coefficient of thermal expansion of the dielectric layer 310.

In an example, each of the interconnected graphene segments is a hollow graphene tube.

In an example, each of the interconnected graphene segments is a graphene tube filled with a non-conducting material.

Figure 6D:
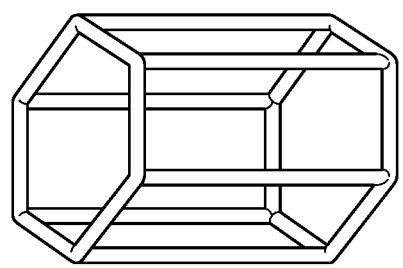
FIGS. 6A-6D show different types of unit cells formed of interconnected segments and that form a microlattice, in accordance with this disclosure.
Figure 6C:
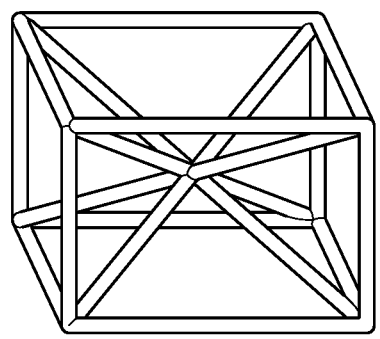
Figure 6B:
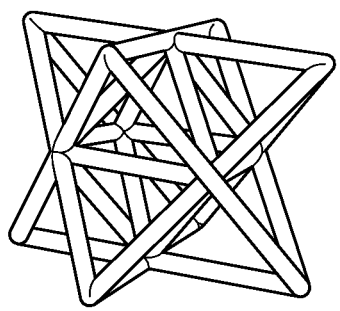
Figure 6A:
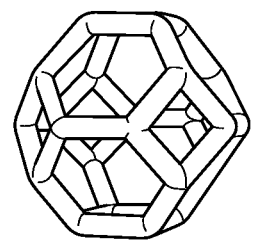

Also, with reference to FIG. 3A, in another aspect of the disclosure, a structure 300 for a semiconductor device includes a dielectric layer 310 and a metal-filled via 330. The structure 300 also includes a plurality of unit cells. Each unit cell is formed of interconnected graphene segments as shown in FIGS. 6A-6D, where the microlattice can be formed by any one of a plurality of these unit cells. Each side of the unit cell represents a "tube" of graphene or solid metal. FIG. 6A shows an octet type unit cell. FIG. 6B shows a tetrakaidekahedron type unit cell. FIG. 6C shows a body-centered tetragonal type unit cell. FIG. 6D shows a hexagonal closed packed type unit cell. There are many other unit cell types and the unit cell type will be selected based on mechanical/thermal properties as well as manufacturability. The plurality of unit cells forms a graphene lattice 350 (a plurality of which are shown in layered form in FIGS. 3A-3D). The graphene lattice 350 is between the dielectric layer 310 and the metal-filled via 330.

In an example, the dielectric layer 310 and the metal-filled via 330 are at least part of a back-end-of-line (BEOL) portion of a semiconductor device.

In an example, the dielectric layer 310 comprises at least one material selected from the group consisting of $SiO_2$, $Al_2O_3$, $ZrO_2$, SiN, Tetraethyl Orthosilicate (TEOS), Polyimide, PBO, BCB, and combinations thereof, and the metal-filled via 330 comprises at least one element selected from the group consisting of W, Cu, Al, Ni, Pd, Au, Ag, and combinations thereof.

In an example, the metal-filled via 330 has a coefficient of thermal expansion that is different than a coefficient of thermal expansion of the dielectric layer 310.

In an example, each of the interconnected graphene segments is a hollow graphene tube.

In an example, each of the interconnected graphene segments is a graphene tube filled with a non-conducting material.

Further, with reference to FIG. 3A, in yet another aspect of the disclosure, a structure 300 for a back-end-of-line (BEOL) portion of an integrated circuit package includes a dielectric layer 310, a metal layer 320 (or 340), and a metal-filled via 330 connected to the metal layer 320 (or 340). The structure 300 also includes a plurality of graphene lattices 350. Each graphene lattice 350 includes a plurality of unit cells. Each unit cell is formed of interconnected graphene segments. A first graphene lattice of the plurality of graphene lattices 350 is between the dielectric layer 310 and the metal layer 320 (or 340). A second graphene lattice of the plurality of graphene lattices 350 is between the dielectric layer 310 and the metal-filled via 330.

In an example, the metal layer 320 (or 340) and the metal-filled via 330 have coefficients of thermal expansion that are different than a coefficient of thermal expansion of the dielectric layer 310.

In an example, each of the interconnected graphene segments is a hollow graphene tube.

In an example, each of the interconnected graphene segments is a graphene tube filled with a non-conducting material.

Figure 4:
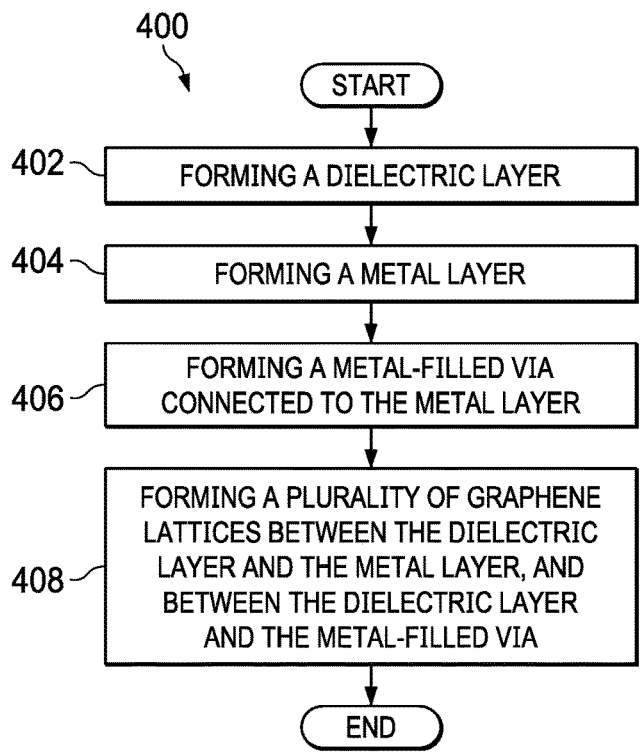
FIG. 4 is a flowchart illustrating a method of forming a structure for a BEOL portion of an integrated circuit package, in accordance with this disclosure.

With reference to FIG. 4, in yet another aspect of the disclosure, a method 400 of forming a structure for a back-end-of-line (BEOL) portion of an integrated circuit package includes forming a dielectric layer (block 402), forming a metal layer (block 404), and forming a metal-filled via connected to the metal layer (block 406). The method also includes forming a plurality of graphene lattices between the dielectric layer and the metal layer, and between the dielectric layer and the metal-filled via (block 408). Each graphene lattice is formed by photo-initiating polymerization of a monomer in a pattern of unit cells to form a polymer lattice, removing the unpolymerized monomer, coating the polymer lattice with a metal, removing the polymer lattice to leave a metal lattice, depositing graphitic carbon on the metal lattice, converting the graphitic carbon to graphene or graphitic tubes, and removing the metal lattice.

In an example of the method, the metal layer and the metal-filled via have coefficients of thermal expansion that are different than a coefficient of thermal expansion of the dielectric layer.

In an example of the method, each of the interconnected graphene segments is a hollow graphene tube.

In an example of the method, each of the interconnected graphene segments is a graphene tube filled with a non-conducting material.

In yet another aspect of the disclosure, a method of forming a structure for a back-end-of-line (BEOL) portion of an integrated circuit package is described herein with reference to FIG. 3A. As mentioned above, FIG. 3A is a cross-sectional side view of a structure of back-end-of-line (BEOL) aluminum (Al) wiring and tungsten (W) vias, for a semiconductor device. Generally, the method of forming FIG. 3A form microlattices in a device with Al wiring and W vias where the Al metal is deposited and etched, and the W via is deposited and chemical mechanical polished to remove it from the planar surface of the dielectric. In an example, specific method steps to form the structure of FIG. 3A include, but are not limited to, the following:

1. Forming a dielectric layer 310 (see also block 402 in FIG. 4)
2. Forming a microlattice 350 of graphene or metal microlattice on the dielectric surface (see also block 408 in FIG. 4)
3. Depositing a metal layer $M_x$, 320 (e.g., Al) on the microlattice/dielectric layer stack (see also block 404 in FIG. 4)
4. Pattern and etch metal layer 320 to form wires
5. Forming additional microlattice 350 of graphene or metal microlattice on dielectric and metal/wire surfaces (see also block 408 in FIG. 4)
6. Pattern and etch the microlattice from dielectric surface
7. Forming additional dielectric layer 310
8. Pattern and etch dielectric layer to form vias 330 to contact underlying metal 320
9. Forming additional microlattice 350 of graphene or metal microlattice on dielectric surface and sidewalls of the vias 330 (see also block 408 in FIG. 4)
10. Deposit metal (different than $M_x$ such as W) including in the vias 330 (see also block 406 in FIG. 4)
11. Planarize metal using Chemical mechanical polishing down to dielectric surface
12. Forming additional microlattice 350 of graphene or metal microlattice on the dielectric surface and on via metal surface (see also block 408 in FIG. 4)

13. Depositing a metal layer $M_y$, 340 (e.g., Al) on the microlattice
14. Pattern and etch the metal layer 340 to form wires
15. Forming additional microlattice 350 of graphene or metal microlattice on dielectric and wire surfaces (see also block 408 in FIG. 4)
16. Forming additional dielectric layer 310
17. Repeat, if desired.

Figure 3B:
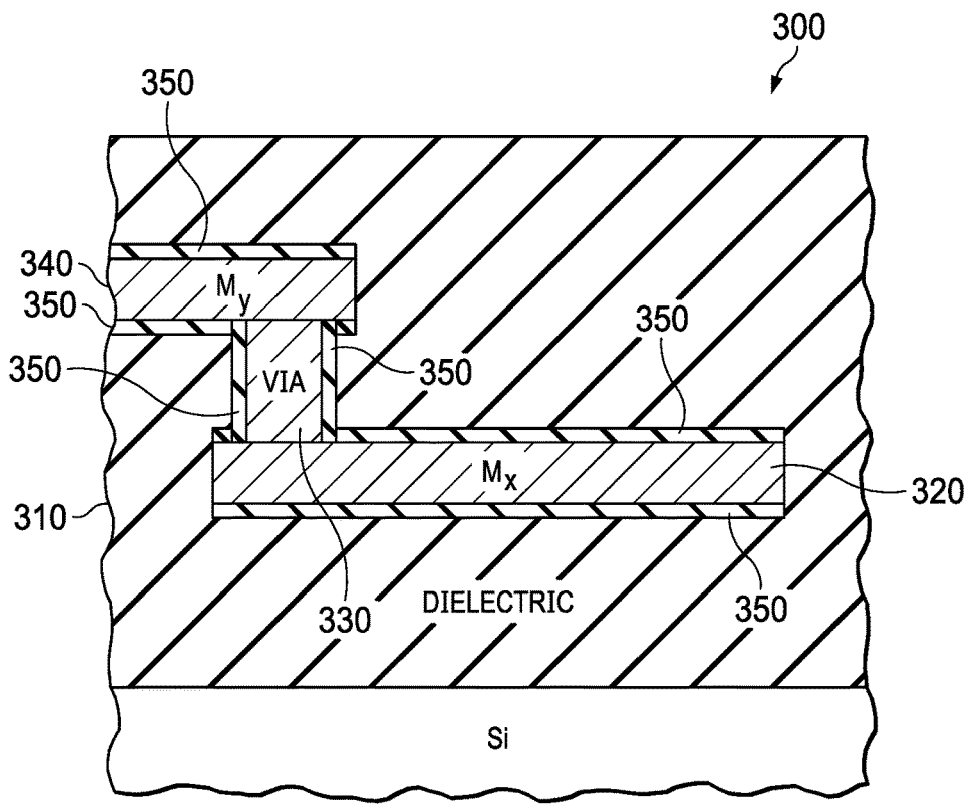
FIG. 3B is a cross-sectional side view of another structure of BEOL wiring and vias with the same metal as the wiring, using a damascene process, for a semiconductor device, in accordance with this disclosure.
Figure 3C:
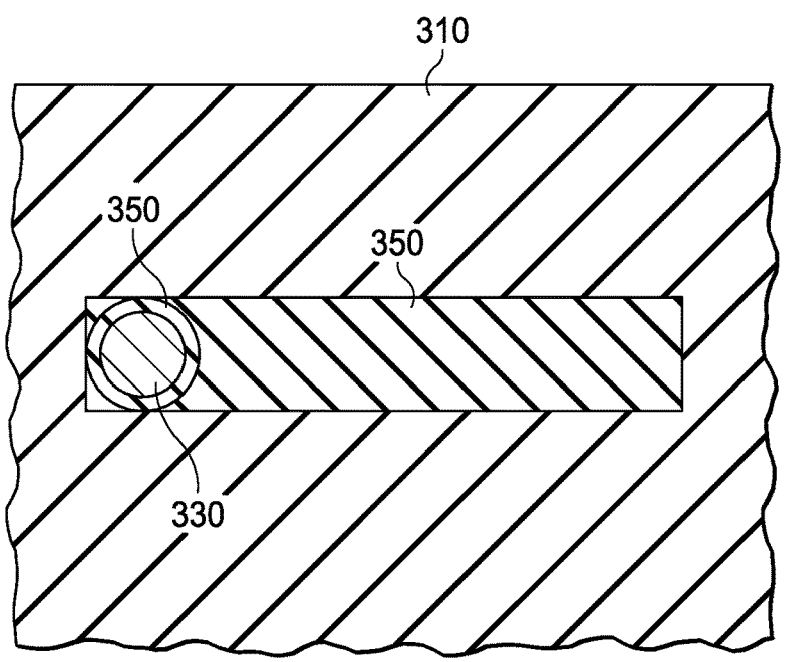
FIG. 3C is a cross-sectional top view of a structure for a semiconductor device taken along line 3C shown in FIG. 3A.
Figure 3D:
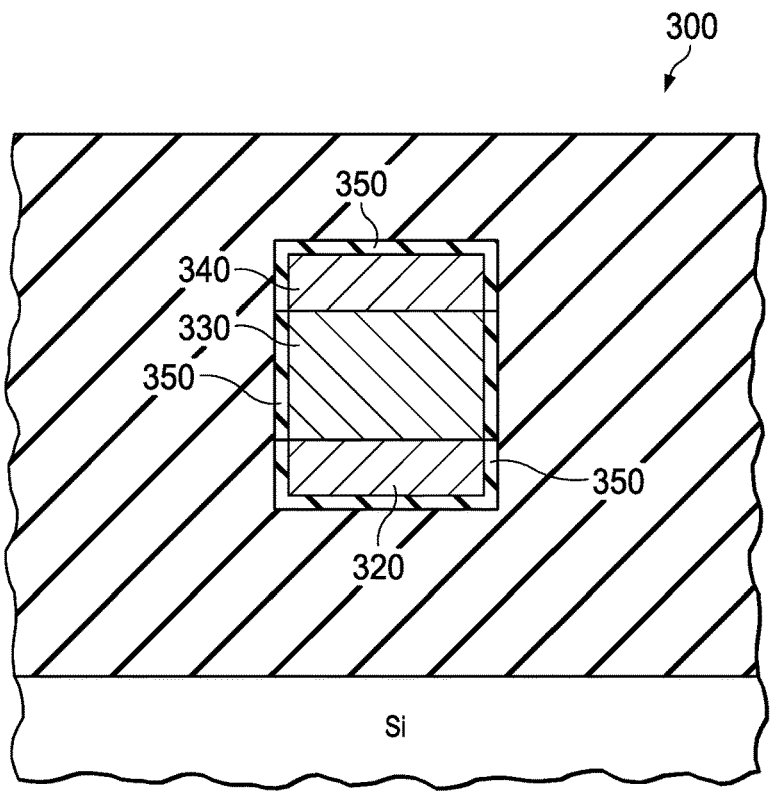
FIG. 3D is a cross-sectional side view of a structure for a semiconductor device taken along line 3D shown in FIG. 3A.

In yet another aspect of the disclosure, a method of forming a structure for a back-end-of-line (BEOL) portion of an integrated circuit package is described herein with reference to FIG. 3B. As mentioned above, FIG. 3B is a cross-sectional side view of another structure of BEOL wiring and vias with the same metal as the wiring, using a damascene process, for a semiconductor device. Generally, the method of forming FIG. 3B is similar to the process of forming the structure of FIG. 3A except the process used to create the metal wiring is a damascene process where the predominant metal used is Cu or Cu alloys. A bonding layer may optionally be employed surrounding the Cu or Cu alloyed metal wiring, i.e., between the Cu (or Cu alloy) and the microlattices. In an example, specific method steps to form the structure of FIG. 3B include, but are not limited to, the following:

1. Forming a dielectric layer 310 (see also block 402 in FIG. 4)
2. Pattern and etch dielectric to form wire routes
3. Forming a microlattice 350 of graphene or metal microlattice on the dielectric surface (see also block 408 in FIG. 4)
4. Depositing a metal layer $M_x$, 320 (e.g., Cu) with an optional barrier layer (such as TaN, TiN, Ru) on the microlattice/dielectric layer stack (see also block 404 in FIG. 4)
5. Chemical mechanical polishing of metal layer 320 down to dielectric surface
6. Forming additional microlattice 350 of graphene or metal microlattice on dielectric and metal surfaces (see also block 408 in FIG. 4)
7. Pattern and etch the microlattice from dielectric surface
8. Forming additional dielectric layer 310
9. Pattern and etch dielectric layer to form vias 330 to contact underlying metal 320
10. Forming additional microlattice 350 of graphene or metal microlattice on dielectric surface and sidewalls of the vias 330 (see also block 408 in FIG. 4)
11. Depositing a metal layer (e.g., Cu) with an optional barrier layer on the microlattice/dielectric layer stack 330 including in the vias 330 (see also block 406 in FIG. 4)
12. Chemical mechanical polishing of metal down to dielectric surface
13. Forming additional dielectric layer 310
14. Pattern and etch dielectric to form wire routes for $M_y$
15. Forming additional microlattice 350 of graphene or metal microlattice on the dielectric surface (see also block 408 in FIG. 4)
16. Depositing a metal layer $M_y$, 340 (e.g., Cu) with an optional barrier layer on the microlattice/dielectric layer stack
17. Chemical mechanical polishing of metal layer 340 down to dielectric surface to form wires
18. Forming additional microlattice 350 of graphene or metal microlattice on the dielectric and wires surfaces (see also block 408 in FIG. 4)
19. Pattern and etch microlattice to remove from dielectric surface
20. Forming additional dielectric layer 310
21. Repeat, if desired.

In another implementation, the microlattice may simply be a metal lattice without graphene.

Figure 5:
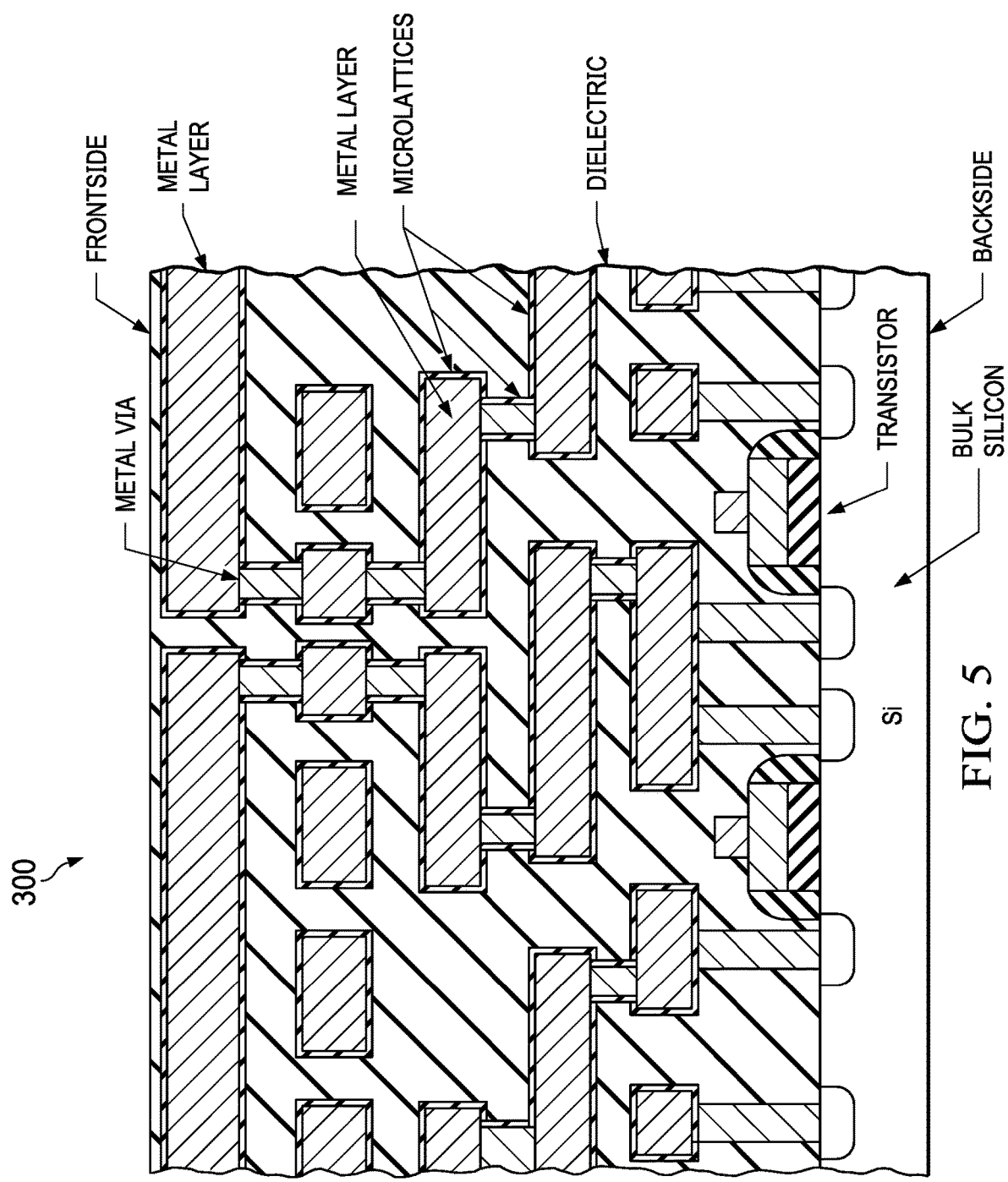
FIG. 5 is a cross-sectional side view of a packaged device including a structure for a semiconductor device, in accordance with this disclosure.

FIG. 5 is a cross-sectional side view of a packaged semiconductor device including a frontside, metal layers as described above, metal vias as described above, microlattices as described above, dielectric layer as described above, transistor(s), (bulk) silicon as described above, and backside.

In any of the examples above, the graphene employed as the lattice could alternatively be replaced with a metal, metal alloy, dielectric, and/or ceramic. The above-mentioned processes of manufacturing the lattice (or portions thereof) may be adjusted accordingly dependent on the material of the lattice employed. Steps in the above-mentioned processes may also be eliminated or added dependent on the material of the lattice employed. Such alternatives are considered to be within the spirit and scope of the disclosure, and may therefore utilize the advantages of the configurations and examples described above.

The method steps in any of the examples described herein are not restricted to being performed in any particular order. Also, structures mentioned in any of the method examples may utilize structures mentioned in any of the device examples. Such structures may be described in detail with respect to the device examples only but are applicable to any of the method examples.

Features in any of the examples described in this disclosure may be employed in combination with features in other examples described herein, such combinations are considered to be within the spirit and scope of the present disclosure.

The above discussion is meant to be illustrative of the principles and various example implementations according to this disclosure. Numerous variations and modifications will become apparent once the above disclosure is fully appreciated. It is intended that the following claims be interpreted to embrace all such variations and modifications.

What is claimed is:

1. A semiconductor device comprising:
   a dielectric layer;
   a metal layer; and
   interconnected graphene segments between the dielectric layer and the metal layer, wherein the interconnected graphene segments form a hollow tube.

2. The semiconductor device of claim 1, wherein the dielectric layer and the metal layer are at least part of a back-end-of-line (BEOL) portion of a semiconductor device.

3. The semiconductor device of claim 1, wherein the dielectric layer comprises at least one material selected from the group consisting of SiO2, Al2O3, ZrO2, SiN, Tetraethyl Orthosilicate (TEOS), Polyimide, polybenzoxazole (PBO), benzocyclobutene (BCB), and combinations thereof, and the metal layer comprises at least one element selected from the group consisting of W, Cu, Al, Ni, Pd, Au, Ag, and combinations thereof.

4. The semiconductor device of claim 1, wherein the metal layer has a coefficient of thermal expansion that is different than a coefficient of thermal expansion of the dielectric layer.

5. The semiconductor device of claim 1, wherein the hollow tube is filled with a non-conducting material.

6. A structure for a semiconductor device, the structure comprising:
   a dielectric layer;

a metal-filled via; and a plurality of unit cells, wherein each unit cell is formed of interconnected segments, and wherein the plurality of unit cells forms a lattice;

wherein the lattice contacts the dielectric layer and the metal-filled via.

7. The structure of claim 6, wherein the dielectric layer and the metal-filled via are at least part of a back-end-of-line (BEOL) portion of a semiconductor device.

8. The structure of claim 6, wherein the dielectric layer comprises at least one material selected from the group consisting of SiO2, Al2O3, ZrO2, SiN, Tetraethyl Orthosilicate (TEOS), Polyimide, polybenzoxazole (PBO), benzocyclobutene (BCB), and combinations thereof, and the metal-filled via comprises at least one element selected from the group consisting of W, Cu, Al, Ni, Pd, Au, Ag, and combinations thereof.

9. The structure of claim 6, wherein the metal-filled via has a coefficient of thermal expansion that is different than a coefficient of thermal expansion of the dielectric layer.

10. The structure of claim 6, wherein each of the interconnected segments is a hollow tube.

11. The structure of claim 6, wherein each of the interconnected segments is a tube filled with a non-conducting material.

12. A structure for a back-end-of-line (BEOL) portion of an integrated circuit package, the structure comprising:

a dielectric layer;

a metal layer;

a metal-filled via connected to the metal layer; and a plurality of lattices, each lattice comprises a plurality of unit cells, wherein each unit cell is formed of interconnected segments;

wherein a first lattice of the plurality of lattices is between the dielectric layer and the metal layer; and wherein a second lattice of the plurality of lattices is between the dielectric layer and the metal-filled via.

13. The structure of claim 12, wherein the metal layer and the metal-filled via have coefficients of thermal expansion that are different than a coefficient of thermal expansion of the dielectric layer.

14. The structure of claim 12, wherein each of the interconnected segments is a hollow tube.

15. The structure of claim 12, wherein each of the interconnected segments is a tube filled with a non-conducting material.

16. A method of forming a structure for a back-end-of-line (BEOL) portion of an integrated circuit package, the method comprising:

forming a dielectric layer;

forming a metal layer;

forming a metal-filled via connected to the metal layer; and forming a plurality of lattices between the dielectric layer and the metal layer, and between the dielectric layer and the metal-filled via, each lattice is formed by:

photo-initiating polymerization of a monomer in a pattern of unit cells to form a polymer lattice, wherein each unit cell is formed of interconnected segments;

removing the unpolymerized monomer;

coating the polymer lattice with a metal;

removing the polymer lattice to leave a metal lattice;

depositing graphitic carbon on the metal lattice;

converting the graphitic carbon to graphene or graphitic tubes; and removing the metal lattice.

17. The method of claim 16, wherein the metal layer and the metal-filled via have coefficients of thermal expansion that are different than a coefficient of thermal expansion of the dielectric layer.

18. The method of claim 16, wherein each of the interconnected segments is a hollow tube.

19. The method of claim 16, wherein each of the interconnected segments is a tube filled with a non-conducting material.

* * * * *